(12) United States Patent
Weng

(10) Patent No.: US 11,280,864 B2
(45) Date of Patent: Mar. 22, 2022

(54) METHOD FOR DETERMINING AND ELIMINATING TIME DELAY BETWEEN RADIO FREQUENCY PULSE AND LAYER SELECTION GRADIENT IN A MAGNETIC RESONANCE DEVICE

(71) Applicant: Siemens Healthcare GmbH, Erlangen (DE)

(72) Inventor: De He Weng, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 64 days.

(21) Appl. No.: 16/856,359

(22) Filed: Apr. 23, 2020

(65) Prior Publication Data
US 2020/0341086 A1 Oct. 29, 2020

(30) Foreign Application Priority Data

Apr. 23, 2019 (CN) .......................... 201910329930.4

(51) Int. Cl.
*G01R 33/46* (2006.01)
*G01R 33/54* (2006.01)
*G01R 33/32* (2006.01)
*G01R 33/561* (2006.01)
*G01R 33/385* (2006.01)

(52) U.S. Cl.
CPC ........ *G01R 33/4625* (2013.01); *G01R 33/32* (2013.01); *G01R 33/3852* (2013.01); *G01R 33/543* (2013.01); *G01R 33/561* (2013.01)

(58) Field of Classification Search
USPC .......................................................... 324/309
See application file for complete search history.

(56) References Cited

U.S. PATENT DOCUMENTS 5,541,512 A * 7/1996 Dumoulin ........ G01R 33/56509
324/306
2006/0253018 A1* 11/2006 Speier .................. G01R 33/561
600/410

* cited by examiner

*Primary Examiner* — Rodney E Fuller
(74) *Attorney, Agent, or Firm* — Schiff Hardin LLP

(57) ABSTRACT

The present application describes techniques for determining and eliminating a time delay between a radio frequency pulse and a layer selection gradient in a magnetic resonance device. The techniques for determining and eliminating the time delay direct include measuring the time delay between the layer selection gradient and the radio frequency pulse by using phase information. This technique is more sensitive and accurate than existing methods that use signal or artifact strength.

8 Claims, 2 Drawing Sheets

METHOD FOR DETERMINING AND ELIMINATING TIME DELAY BETWEEN RADIO FREQUENCY PULSE AND LAYER SELECTION GRADIENT IN A MAGNETIC RESONANCE DEVICE

CROSS-REFERENCE TO RELATED APPLICATIONS

The present application claims the benefit of the filing date of China patent application no. 201910329930.4, filed on Apr. 23, 2019, the contents of which are incorporated herein by reference in their entirety.

TECHNICAL FIELD

The disclosure relates to magnetic resonance and, in particular, to a method for determining and eliminating a time delay between a radio frequency pulse and a layer selection gradient in a magnetic resonance device.

BACKGROUND

A magnetic resonance (MR) sequence using radio frequency (RF) pulses and gradients can excite a specific plane, thick layer or voxel. After excitation, all linear phase radio frequency pulses require a re-phase gradient. The synchronization of a radio frequency pulse and a gradient pulse has strict requirements. For example, the center of a full shape radio frequency pulse should occur at the same time as the center of a thin or thick layer selection gradient. However, in reality, it is difficult to satisfy this condition precisely. For example, the gradient is not consistent with the radio frequency pulse in control precision, the switching of the gradient generates eddy current, and the like, which all prevent the condition from being satisfied. If the center of the radio frequency pulse mismatches the center of the thin or thick layer selection gradient, a phase loss will occur and the final image signal-to-noise ratio will decrease. For two-dimensional excitation, the mismatch between the radio frequency pulse and the layer selection gradient can also generate an excitation artifact.

Conventional approaches for correcting a time delay between a gradient and data sampling can indirectly correct the time delay between the gradient and the radio frequency pulse. The most common correction method is to check the time difference between the center of a data sampling time in a gradient echo sequence and a time corresponding to the maximum signal. The distance between the time corresponding to the maximum signal and the center of the data sampling time represents the time delay between the radio frequency pulse and the layer selection gradient. Other methods to directly correct the time delay between the layer selection gradient and the radio frequency pulse include manually adjusting the time delay between the layer selection gradient and the radio frequency pulse. The excitation result is checked, such as residual artifacts and signal strengths, and the time delay in the minimum residual artifacts or the maximum signal strengths is selected as the time delay between the layer selection gradient and the radio frequency pulse. Such conventional approaches, however, suffer from various drawbacks.

SUMMARY

In view of this, the present disclosure proposes a method for determining and eliminating a time delay between a radio frequency pulse and a layer selection gradient in a magnetic resonance device.

According to a first aspect of the present disclosure, a method for determining a time delay between a radio frequency pulse and a layer selection gradient in a magnetic resonance device is provided, wherein the layer selection gradient is in a first direction, the method comprising:

providing a radio frequency pulse and the layer selection gradient;

applying the radio frequency pulse and the layer selection gradient to an imaging object at the same time;

performing data sampling with a spatial encoding gradient, wherein a read-out encoding gradient is in the first direction, a phase encoding gradient is in a second direction, and the second direction is orthogonal to the first direction;

acquiring a phase of an image in the first direction; and determining a time delay between the radio frequency pulse and the layer selection gradient according to the phase of the image in the first direction.

In an embodiment, said determination of a time delay between the radio frequency pulse and the layer selection gradient according to the phase of the image in the first direction comprises determining the time delay between the radio frequency pulse and the layer selection gradient according to the following formula:

$$\Delta\emptyset = \gamma G \tau (z - z_0),$$

where $\Delta\emptyset$ is the phase of the image in the first direction, $\gamma$ is a gyromagnetic ratio constant, G is the magnitude of the layer selection gradient, $\tau$ is the time delay between the radio frequency pulse and the layer selection gradient, z is the position of a point on the image in the first direction, and $z_0$ is the position of the center of the image in the first direction.

In an embodiment, the spatial encoding gradient is of a gradient echo or planar echo encoding mode.

According to a second aspect of the present disclosure, a method for eliminating a time delay between a radio frequency pulse and a layer selection gradient in a magnetic resonance device is provided, wherein the layer selection gradient is in a first direction, the method comprising:

providing a radio frequency pulse and the layer selection gradient;

applying the radio frequency pulse and the layer selection gradient to an imaging object at the same time;

performing data sampling with a spatial encoding gradient, wherein a read-out encoding gradient is in the first direction, a phase encoding gradient is in a second direction, and the second direction is orthogonal to the first direction;

acquiring a phase of an image in the first direction;

determining a time delay between the radio frequency pulse and the layer selection gradient according to the phase of the image in the first direction; and adjusting the time delay between the radio frequency pulse and the layer selection gradient to eliminate a phase difference of points on the image in the first direction.

In an embodiment, said determination of a time delay between the radio frequency pulse and the layer selection gradient according to the phase of the image in the first direction comprises determining the time delay between the radio frequency pulse and the layer selection gradient according to the following formula:

$$\Delta\emptyset = \gamma G \tau (z - z_0),$$

where $\Delta\emptyset$ is the phase of the image in the first direction, $\gamma$ is a gyromagnetic ratio constant, G is the magnitude of the layer selection gradient, $\tau$ is the time delay between the radio frequency pulse and the layer selection gradient, z is the position of a point on the image in the first direction, and $z_0$ is the position of the center of the image in the first direction.

In an embodiment, the spatial encoding gradient is of a gradient echo or planar echo encoding mode.

The method for determining and eliminating a time delay between a layer selection gradient and a radio frequency pulse in the present disclosure directly measures the time delay between the layer selection gradient and the radio frequency pulse by using phase information. This method is more sensitive and more accurate than existing methods that use signal or artifact strength. In addition, this method requires only one measurement, and is therefore faster than methods that manually adjust some parameters to find the minimum or maximum signal.

BRIEF DESCRIPTION OF THE DRAWINGS/FIGURES

The above and other features and advantages of the present disclosure will be more apparent to those of ordinary skill in the art from the detailed description of preferred embodiments of the present disclosure with reference to the accompanying drawings, in which.

DETAILED DESCRIPTION

In order to make the object, technical solutions, and advantages of the present disclosure more apparent, the present disclosure will be described in further detail by way of embodiments hereinafter.

Figure 1:
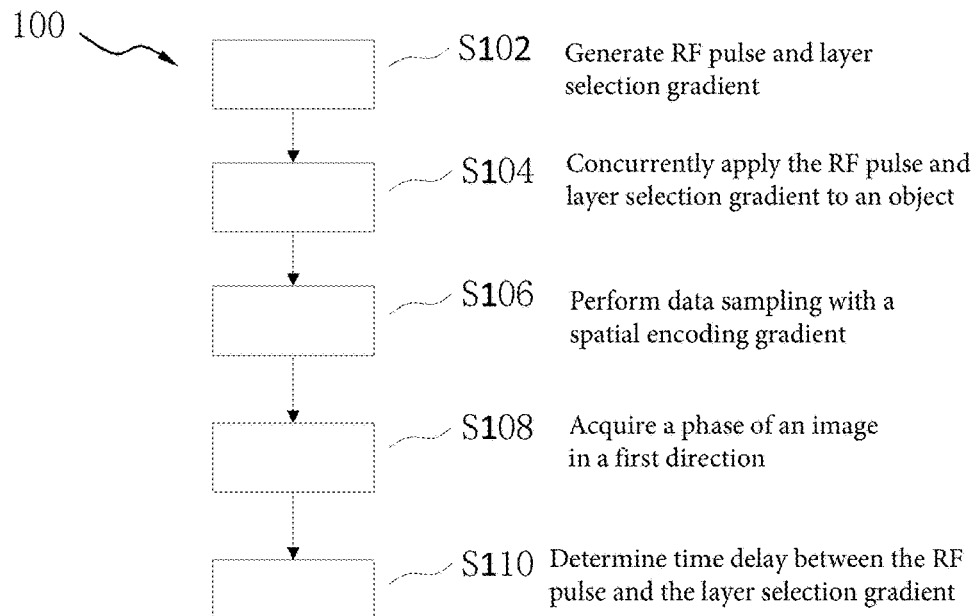
FIG. 1 is a flowchart of a method for determining a time delay between a layer selection gradient and a radio frequency pulse according to a first embodiment of the present disclosure.

FIG. 1 is a flowchart of a method 100 for determining a time delay between a layer selection gradient and a radio frequency pulse according to a first embodiment of the present disclosure. The method 100 includes steps S102, S104, S106, S108, and S110. In step S102, a radio frequency pulse and a layer selection gradient are provided.

Figure 2:
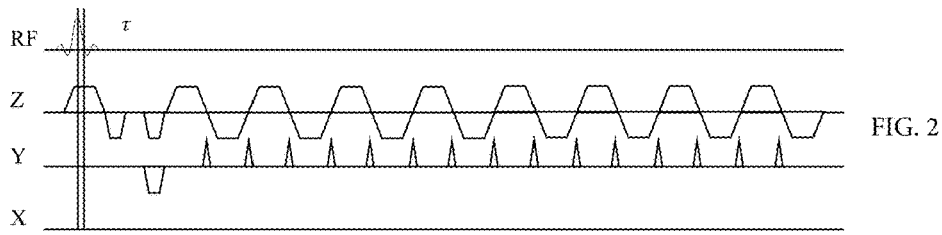
FIG. 2 is a sequence diagram of determining a time delay between a layer selection gradient and a radio frequency pulse according to an embodiment of the present disclosure.

FIG. 2 is a sequence diagram of determining a time delay between a layer selection gradient and a radio frequency pulse according to an embodiment of the present disclosure. FIG. 2 shows a linear phase radio frequency pulse and a corresponding layer selection gradient, and the gradient is in a first direction (the Z-axis direction in this embodiment). However, the method of the present disclosure is not limited to a linear phase radio frequency pulse and a layer selection gradient, and is also applicable in the case of multiple pulses and multiple gradients.

As shown in FIG. 2, the time delay r between the layer selection gradient and the radio frequency pulse is the distance between the center of the radio frequency pulse and a position where the area formed by the right portion on the layer selection gradient and the Z axis is equal to the area formed by a re-phase gradient and the Z axis.

In step S104, the radio frequency pulse and the layer selection gradient are applied to an imaging object at the same time.

In step S106, data sampling is performed with a spatial encoding gradient, wherein a read-out encoding gradient is in the Z-axis direction, a phase encoding gradient is in a second direction (the Y-axis direction in this example), and the Y-axis direction is orthogonal to the Z-axis direction. In other words, the sequence is similar to a normal thin or thick layer selection sequence, except that only the read gradient is moved to the axis where the thin or thick layer selection gradient is located. The spatial-encoding gradient is of a gradient echo or planar echo encoding mode, and FIG. 2 shows a spatial encoding gradient of the planar echo encoding mode.

In step S108, a phase of an image in the first direction is acquired (e.g., a phase of an image associated with an object being imaged via the magnetic resonance imaging device). Phase information of the image is used to calculate a time delay.

In step S110, a time delay between the radio frequency pulse and the layer selection gradient is determined according to the phase of the image in the first direction. If there is a time delay between the radio frequency pulse and the layer selection gradient, and it is assumed that the magnitude of the layer selection gradient is G and the time delay between the layer selection gradient and the radio frequency pulse is $\tau$, an additional phase $\Delta\emptyset$, caused by the time delay $\tau$, of a point on the image along the axis where the layer selection gradient is located can be expressed in Equation 1 below as follows:

$$\Delta\emptyset = \gamma G \tau (z - z_0), \qquad \text{Eqn. 1:}$$

In this embodiment, the time delay between the radio frequency pulse and the layer selection gradient is determined according to the above formula. $\gamma$ is a gyromagnetic ratio constant, z is the position of a point on the image along the axis where the layer selection gradient is located, and $z_0$ is the position of the center of the image along the axis where the layer selection gradient is located.

It can be seen from the above formula that $\Delta\emptyset$ is a function of G, $\tau$, and $z-z_0$, and the above formula can also be expressed as follows in Equation 2:

$$\Delta\emptyset(G, z-z_0, \tau) = \gamma G \tau (z - z_0) \qquad \text{Eqn. 2:}$$

Figure 3:
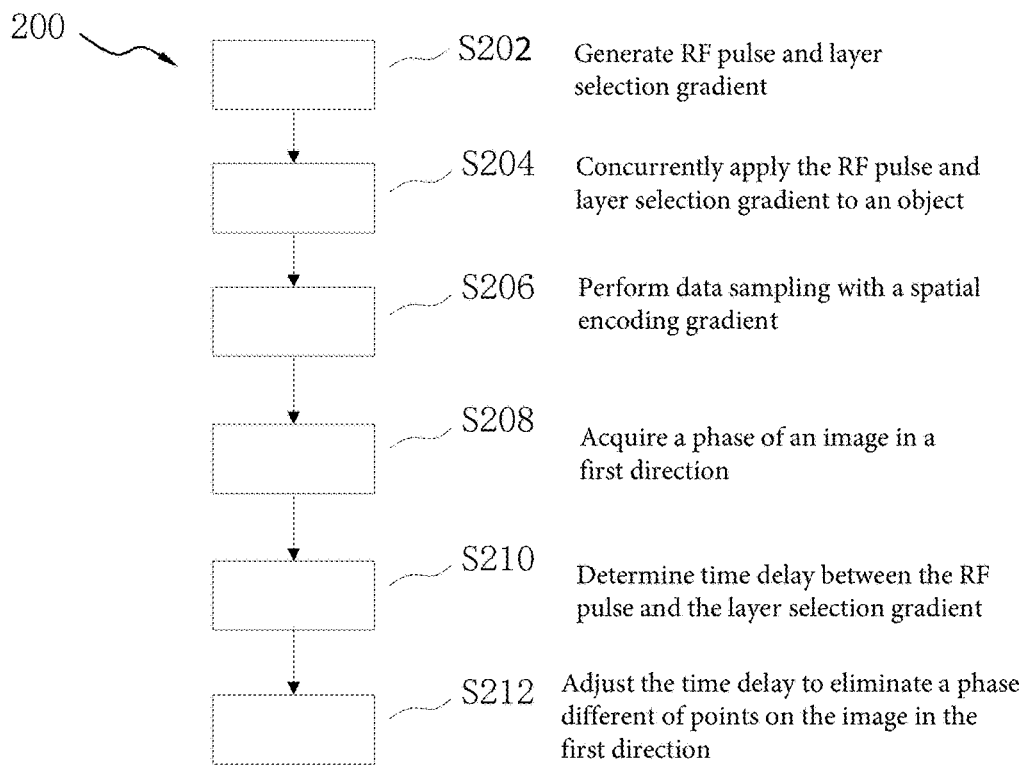
FIG. 3 is a flowchart of a method for eliminating a time delay between a layer selection gradient and a radio frequency pulse according to a second embodiment of the present disclosure.

FIG. 3 is a flowchart of a method 200 for eliminating a time delay between a layer selection gradient and a radio frequency pulse according to a second embodiment of the present disclosure. The method 200 includes steps S202, S204, S206, S208, S210, and S212. Steps S202, S204, S206, S208 and S210 are respectively identical to steps S102, S104, S106, S108 and S110. In step S212, the time delay between the radio frequency pulse and the layer selection gradient is adjusted to eliminate a phase difference of points on the image in the first direction.

The method for determining and eliminating a time delay between a layer selection gradient and a radio frequency pulse in the present disclosure directly measures the time delay between the layer selection gradient and the radio frequency pulse by using phase information. This method is more sensitive and accurate than existing methods that use signal or artifact strength. In addition, this method requires only one measurement, and is therefore faster than methods that manually adjust some parameters to find the minimum or maximum signal.

Figure 4:
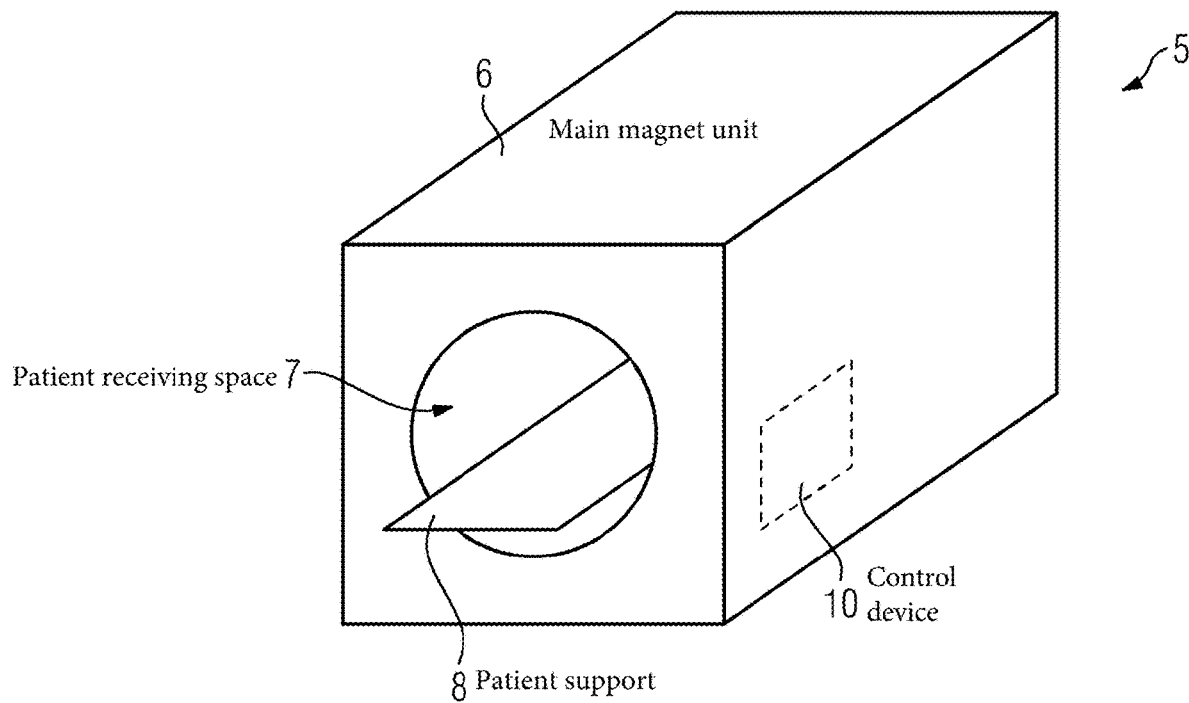
FIG. 4 illustrates an example magnetic resonance imaging device, in accordance with an embodiment of the present disclosure.

FIG. 4 illustrates an example magnetic resonance imaging device, in accordance with an embodiment of the present disclosure. The magnetic resonance imaging device as shown in FIG. 4 may also be referred to as a magnetic resonance imager or magnetic resonance imaging system. This comprises, as known in principle, a main magnet unit 6 (e.g. a magnetic data acquisition unit or scanner) that defines a patient receiving space 7 into which a patient can be moved by means of a patient support 8 (not shown in further detail here). Surrounding the patient support 8, a high frequency arrangement of the magnetic resonance imaging device 5 and a gradient coil arrangement of the magnetic resonance imaging device can be provided and, for the sake of clarity, these are also not shown.

The magnetic resonance imaging apparatus 5 may be controlled by a control device 10, which may also be referred to as a control computer, control circuitry, of control unit. The control device 10 is configured to communicate with and/or control one or more components of the magnetic resonance imaging device 5. In various aspects, the control device 5 may do so to perform one or more method according to the present disclosure, such as the method 100, 200, for example, as described herein with reference to FIGS. 1 and 3. The control device 10 may be implemented, for example, as one or more computer processors. Thus, the various components of the control device 10 as discussed below may be implemented as separate processors, or their respective functions shared among one or more processors of the control device 10. The various functions of the components of the control device 10, which are discussed directly below, may be achieved via any suitable combination of one or more hardware processors, software, or a combination of both.

Figure 5:
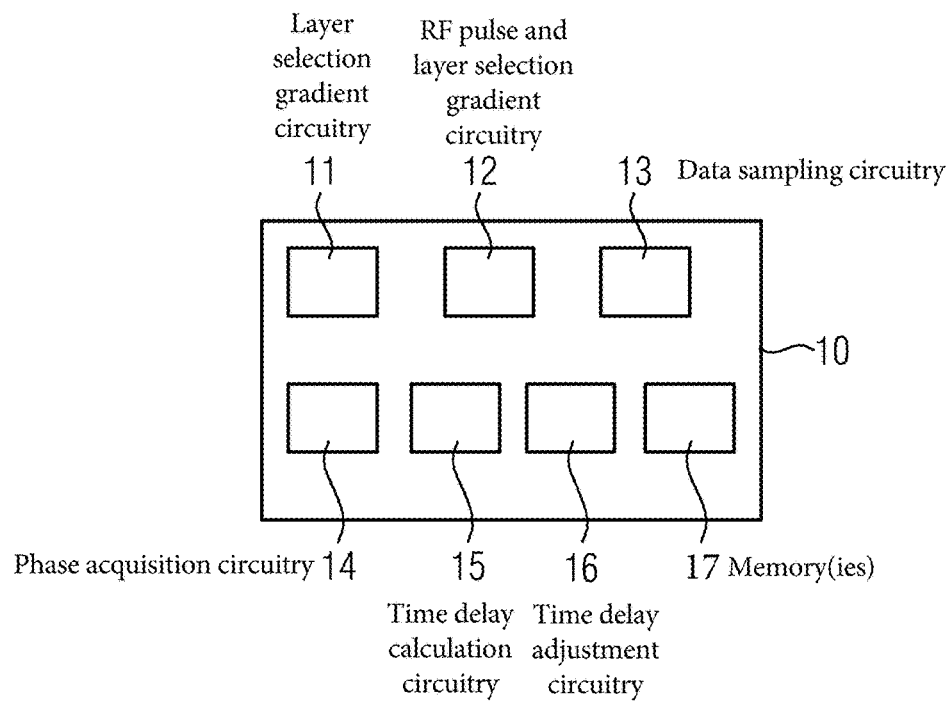
FIG. 5 illustrates an example functional structure of a control device of the magnetic resonance imaging device shown in FIG. 4, in accordance with an embodiment of the present disclosure.

FIG. 5 shows the functional structure of the control device 10. The control device 10 comprises RF pulse and a layer selection gradient circuitry 11 to control the magnetic resonance imaging device 5 to generate RF pulses and layer selection gradients, in this example as discussed in steps S102/S202 of FIGS. 1 and 3. The control device 10 also includes RF pulse and layer selection gradient circuitry 12 configured to control the magnetic resonance imaging device 5 to apply the RF pulses and layer selection gradients to an object (e.g., a patient) at the same time, in this example as discussed in steps S104/S204 of FIGS. 1 and 3.

The control device 10 also includes data sampling circuitry 13 configured to control the magnetic resonance imaging device 5 to perform data sampling with a spatial encoding gradient, in this example as discussed in steps S106/S206 of FIGS. 1 and 3. Furthermore, The control device 10 also includes phase acquisition circuitry 14 configured to control the magnetic resonance imaging device 5 to acquire the phase of an image in a first direction, in this example as discussed in steps S108/S208 of FIGS. 1 and 3.

Moreover, the control device 10 includes time delay calculation circuitry 15 configured to calculate a time delay between the radio frequency pulse and the layer selection gradient according to the phase of the image in the first direction, in this example as discussed in steps S110/S210 of FIGS. 1 and 3. The control device 10 may also comprise time delay adjustment circuitry 16 to control the magnetic resonance imaging device 5 to adjust the time delay between the radio frequency pulse and the layer selection gradient to eliminate a phase difference of points on the image in the first direction, in this example as discussed in step S212 of FIG. 3. Of course, the control device 10 may further comprise a user interface for receiving information entered by the user, which is not shown in the Figures for purposes of brevity.

The control device 10 may also include one or more memories 17, such as non-transitory computer-readable mediums, for example. The one or more memories 17 may be configured as any suitable type of storage mediums such as volatile or non-volatile storage devices, and may form part of the control device 10 or otherwise be accessed by the control device 10 (e.g., via a network), and thus be external to the control device 10 (not shown). Aspects include any of the methods being performed additionally or alternatively via executable instructions stored in the one or more memories 17, which may be executed by one or more components of the control device 10 and/or the magnetic resonance imaging device 5 (e.g., via one or more processors).

The above description is only the preferred embodiments of the present disclosure and is not intended to limit the present disclosure. Any modifications, equivalent substitutions, improvements, etc. made within the spirit and principles of the present disclosure should be included within the scope of protection of the present disclosure.

Thus, embodiments include machine-readable instruction(s) being stored on the computer-readable storage medium. The machine-readable instruction, when executed by one or more processors, may thus cause the one or more processors to perform any one of the methods described above. Furthermore, embodiments include a system or apparatus being equipped with a readable storage medium; software program code realizing a function of any one of the embodiments above may be stored on the readable storage medium, and a computer or processor of the system or apparatus may be caused to read and execute a machine-readable instruction stored in the readable storage medium.

In such a scenario, program code read from the readable storage medium may itself realize a function of any one of the embodiments above, hence machine-readable code and the readable storage medium storing the machine-readable code form part of the present disclosure.

Examples of readable storage media include floppy disks, hard disks, magneto-optical disks, optical disks (such as CD-ROM, CD-R, CD-RW, DVD-ROM, DVD-RAM, DVD-RW, DVD+RW), magnetic tapes, non-volatile memory cards and ROM. Optionally, program code may be downloaded (e.g. from a server computer or a cloud) via a suitable communication network.

Those skilled in the art should understand that various changes in form and amendments may be made to the embodiments disclosed above without deviating from the substance of the disclosure. Thus, the scope of protection of the present disclosure shall be defined by the attached claims and elsewhere throughout the disclosure as described herein.

It must be explained that not all of the steps and module/circuitry in the flows and system structure diagrams above are necessary; certain steps or module/circuitry may be omitted according to actual requirements. Moreover, the apparatuses described herein may include additional fewer, or alternative components. Furthermore, the various module/circuitry components as discussed herein are separated for ease of explanation, although embodiments include the functionality, hardware, and/or software associated with these modules/circuitry being combined or separated in accordance with a particular application, the availability of hardware components, etc. The apparatus structures described in the embodiments above may be physical structures, and may also be logical structures, i.e. some module/circuitry might be realized by the same physical entity, or some module/circuitry might be realized by multiple physical entities, or realized jointly by certain components in multiple independent devices. Also, the order in which steps are executed is not fixed, but may be adjusted as required The present disclosure has been displayed and explained in detail above by means of the accompanying drawings and preferred embodiments, but the present disclosure is not limited to these disclosed embodiments. Based on the embodiments described above, those skilled in the art will know that further embodiments of the present disclosure, also falling within the scope of protection of the present disclosure, could be obtained by combining code checking means in different embodiments above.

What is claimed is:

1. A method for determining a time delay between a radio frequency pulse and a layer selection gradient in a magnetic resonance imaging device, comprising:

concurrently applying the radio frequency pulse and the layer selection gradient to an object in the magnetic resonance imaging device, the layer selection gradient being oriented in a first direction;

performing data sampling with a spatial encoding gradient using a read-out encoding gradient oriented in the first direction and a phase encoding gradient oriented in a second direction, the second direction being orthogonal to the first direction;

acquiring a phase of an image associated with the object in the first direction; and determining the time delay between the radio frequency pulse and the layer selection gradient according to the phase of the image in the first direction.

2. The method of claim 1, wherein determining the time delay between the radio frequency pulse and the layer selection gradient comprises:

determining the time delay between the radio frequency pulse and the layer selection gradient according to the following formula:

$$\Delta\emptyset = \gamma G\tau(z-z_0),\text{ wherein:}$$

$\Delta\emptyset$ represents the phase of the image in the first direction, $\gamma$ represents a gyromagnetic ratio constant, G represents a magnitude of the layer selection gradient, $\tau$ represents the time delay between the radio frequency pulse and the layer selection gradient, z represents a position of a point on the image in the first direction, and $z_0$ represents a position of the center of the image in the first direction.

3. The method of claim 1, wherein the spatial encoding gradient is associated with at least one of a gradient echo encoding mode or a planar echo encoding mode.

4. The method of claim 1, further comprising:

adjusting the time delay between the radio frequency pulse and the layer selection gradient to eliminate a phase difference of points on the image in the first direction.

5. A non-transitory computer readable medium having instructions stored thereon that, when executed by one or more processors associated with a magnetic resonance imaging device, cause the magnetic resonance imaging device to determine a time delay between a radio frequency pulse and a layer selection gradient by:

concurrently applying the radio frequency pulse and the layer selection gradient to an object in the magnetic resonance imaging device, the layer selection gradient being oriented in a first direction;

performing data sampling with a spatial encoding gradient using a read-out encoding gradient oriented in the first direction and a phase encoding gradient oriented in a second direction, the second direction being orthogonal to the first direction;

acquiring a phase of an image associated with the object in the first direction; and determining the time delay between the radio frequency pulse and the layer selection gradient according to the phase of the image in the first direction.

6. The non-transitory computer readable medium of claim 5, further including instructions to determine the time delay between the radio frequency pulse and the layer selection gradient according to the following formula:

$$\Delta\emptyset = \gamma G\tau(z-z_0),\text{ wherein:}$$

$\Delta\emptyset$ represents the phase of the image in the first direction, $\gamma$ represents a gyromagnetic ratio constant, G represents a magnitude of the layer selection gradient, $\tau$ represents the time delay between the radio frequency pulse and the layer selection gradient, z represents a position of a point on the image in the first direction, and $z_0$ represents a position of the center of the image in the first direction.

7. The non-transitory computer readable medium of claim 5, wherein the spatial encoding gradient is associated with at least one of a gradient echo encoding mode or a planar echo encoding mode.

8. The non-transitory computer readable medium of claim 5, further including instructions that, when executed by the one or more processors associated with the magnetic resonance imaging device, cause the magnetic resonance imaging device to:

adjust the time delay between the radio frequency pulse and the layer selection gradient to eliminate a phase difference of points on the image in the first direction.

* * * * *